(12) United States Patent
Hsueh et al.

(10) Patent No.: US 7,160,794 B1
(45) Date of Patent: Jan. 9, 2007

(54) METHOD OF FABRICATING NON-VOLATILE MEMORY

(75) Inventors: Ming-Hsiang Hsueh, Hsinchu (TW); Shih-Chang Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/162,042

(22) Filed: Aug. 26, 2005

(51) Int. Cl.
*H01L 21/8247* (2006.01)
(52) U.S. Cl. .............................. 438/593; 257/E21.209; 438/926
(58) Field of Classification Search ........ 438/257–267, 438/927; 257/E21.209
See application file for complete search history.

(56) References Cited

U.S. PATENT DOCUMENTS 5,556,799 A 9/1996 Hong .......................... 438/264
6,368,923 B1 * 4/2002 Huang ........................ 438/275
6,475,863 B1 * 11/2002 Kim ........................... 438/264
6,853,028 B1 * 2/2005 Kim et al. ................... 257/315

* cited by examiner

*Primary Examiner*—Richard A. Booth
(74) *Attorney, Agent, or Firm*—Jiang Chyun IP Office

(57) ABSTRACT

A method for manufacturing a non-volatile memory. The method comprises steps of forming a first dielectric layer on a substrate and forming a dummy gate layer on the first dielectric layer. Further, the dummy gate layer is defined to form a plurality of dummy gates and a doped region is formed in the substrate by using the dummy gates as a mask. A second dielectric layer is formed on a portion of the first dielectric layer corresponding to the location of the doped region and the dummy gates are removed to expose a portion of the first dielectric layer. A conductive layer is formed over the substrate to cover the second dielectric layer and the first dielectric layer.

15 Claims, 7 Drawing Sheets

METHOD OF FABRICATING NON-VOLATILE MEMORY

BACKGROUND OF THE INVENTION

1. Field of Invention

The present invention relates to a method for manufacturing a memory. More particularly, the present invention relates to a method for manufacturing a non-volatile memory.

2. Description of Related Art

Memory, so to speak, is a semiconductor device for storing data or information. When the function of a computer microprocessor becomes more powerful and the programs and computation of the software gets more complicated, the demand for the capacity of a memory increases accordingly. In order to satisfy the trend of the demand mentioned above, the technology and process to manufacture the inexpensive memory with high capacity has become the drive for manufacturing a high integrated device.

Among various memory products, non-volatile memory, having the ability for performing store, read, or erase data repeatedly and without loss of data after disconnection of power, has become a semiconductor device widely accepted by personal computer and electronic equipment.

FIGS. 1A through 1E are schematic diagrams showing a conventional method for manufacturing a non-volatile memory.

As shown in FIG. 1A, a substrate 100 having a trench isolation structure (not shown) for defining an active region is provided. A silicon oxide layer 102 is formed on the substrate 100. A first polysilicon layer 104 (poly 1) is formed on the silicon oxide layer 102. A silicon nitride layer 106 is formed on the first polysilicon layer 104.

As shown in FIG. 1B, a patterned photo resist layer (not shown) is formed on the silicon nitride layer 106. By using the patterned photo resist layer as an mask, the silicon nitride layer 106 is patterned to form a silicon nitride layer 106a. After the patterned photo resistance layer is removed, another process is performed to pattern the first polysilicon layer 104 to form a first polysilicon layer 104a by using the silicon nitride layer 106a as a mask.

As shown in FIG. 1C, by using the silicon nitride layer 106a as a mask, several source/drain region 108 are formed in the substrate 100. A chemical vapor deposition is performed to form a dielectric layer 110 over the substrate 100.

As shown in FIG. 1D, a planarization process is performed to remove a portion of the dielectric layer 110 to expose the top corner of the silicon nitride layer 106a. A process is performed to remove a portion of the dielectric layer 110 to form a dielectric layer 110a. The silicon nitride layer 106a is removed.

As shown in FIG. 1E, a second polysilicon layer 112 is formed over the substrate 100. The second polysilicon layer 112 (poly 3) orthogonally crosses the first polysilicon 104a and is served as a word line. Thereafter, the conventional processes for forming the non-volatile memory are performed. The details of the following processes are well know in the art and are not described hereafter.

However, in the convention method for manufacturing the non-volatile memory mentioned above, there exist problems described below. In the process for defining the first polysilicon layer 104, the polysilicon residual occurs due to the problem of that the etching process is uneasy to be controlled and the etching error happens. Therefore, the profile of the first polysilicon layer 104a is a taper profile indicated by an arrow labeled 113 in FIG. 1B. As a result, the bridge phenomenon happens between the later formed word lines (second polysilicon layer 112) so as to induce the leakage and decrease the reliability of the device.

Besides, the etching residual in dry etching process and the following wet process leads to the formation of the hole (indicated by an arrow labeled 116 in FIG. 1D) penetrating through the silicon oxide layer 102 due to the reaction between the etchant and the etching residual 114. Hence, while the second polysilicon layer 112 (word line) is formed over the substrate 100, the second polysilicon layer 112 fills into the hole 116 (as shown in FIG. 1D) and the second polysilicon layer 112 is abnormally electrically connected to the substrate 100 through the polysilicon material 118 (as shown in FIG. 1E) filling in the hole 116 (as shown in FIG. 1D). As a result, the device is invalid and the yield is decreased.

SUMMARY OF THE INVENTION

Accordingly, at least one objective of the present invention is to provide a method for manufacturing a non-volatile memory capable of solving the problem caused by the polysilicon residual and avoiding the device from being short. Therefore, the yield is increased.

To achieve these and other advantages and in accordance with the purpose of the invention, as embodied and broadly described herein, the invention provides a method for manufacturing a non-volatile memory. The method comprises steps of forming a first dielectric layer on a substrate and forming a dummy gate layer on the first dielectric layer. Further, the dummy gate layer is defined to form a plurality of dummy gates and a doped region is formed in the substrate by using the dummy gates as a mask. A second dielectric layer is formed over the substrate. The second dielectric layer is partially removed to expose a portion of the first dielectric layer. A conductive layer is formed over the substrate to cover the second dielectric layer and the first dielectric layer.

In the present invention, the material of the dummy gate layer includes silicon nitride. The method for forming the dummy gate layer includes a chemical vapor deposition. The first dielectric layer includes a tunnel oxide layer. When the dielectric layer is the tunnel oxide layer, the material of the tunnel oxide layer includes silicon oxide and the method of forming the tunnel oxide layer includes a thermal oxidation. Also, the first dielectric layer includes a complex dielectric layer. When the first dielectric layer is the complex dielectric layer, the complex dielectric layer includes a silicon oxide/silicon nitride/silicon oxide layer and the method for forming the complex dielectric layer includes a chemical vapor deposition or thermal oxidation process. Furthermore, the method for removing the dummy gates includes an etching process. The material of the second dielectric layer includes silicon oxide. The method for forming the second dielectric layer includes a high density plasma chemical vapor deposition. The material of the conductive layer includes polysilicon. In addition, the method of forming the conductive layer includes a chemical vapor deposition and the method of forming the doped region includes an ion implantation process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2A through 2G are schematic diagrams showing a method for manufacturing a non-volatile memory according to one of the preferred embodiment of the present invention.

Figure 1A:
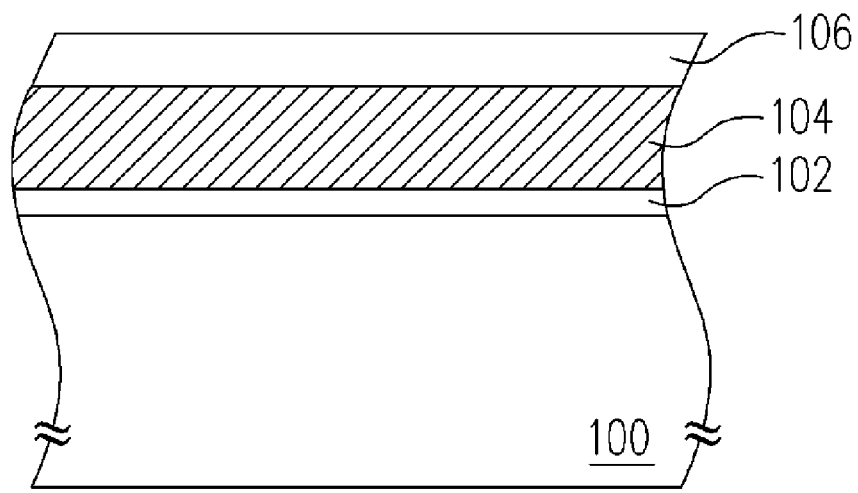
FIGS. 1A through 1E are schematic diagrams showing a conventional method for manufacturing a non-volatile memory.
Figure 1B:
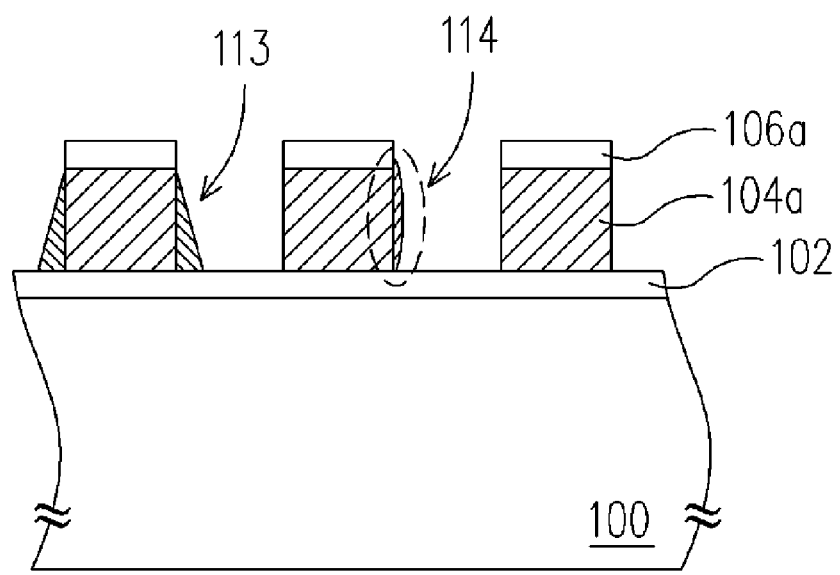
Figure 1C:
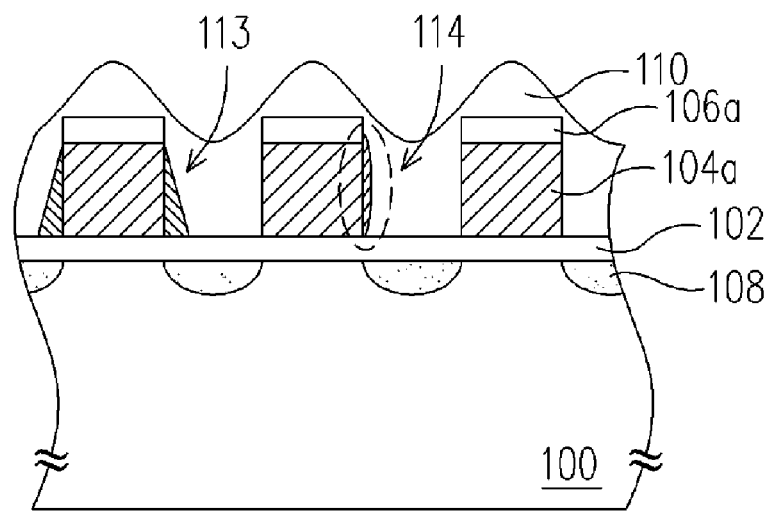
Figure 1D:
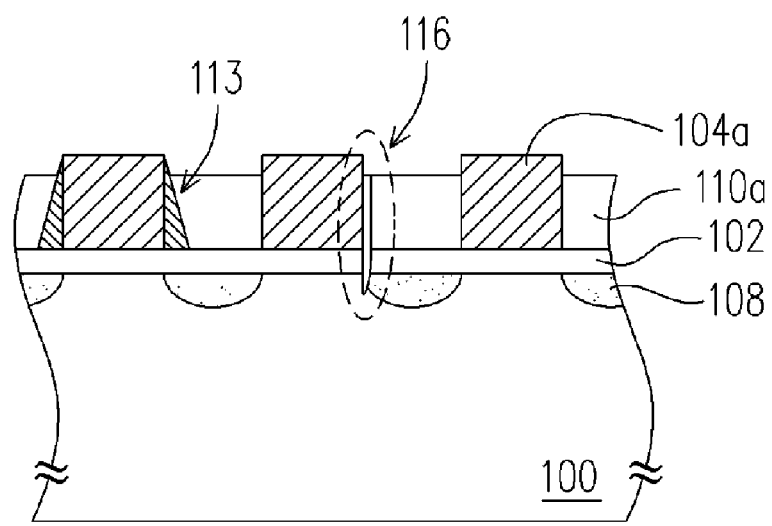
Figure 1E:
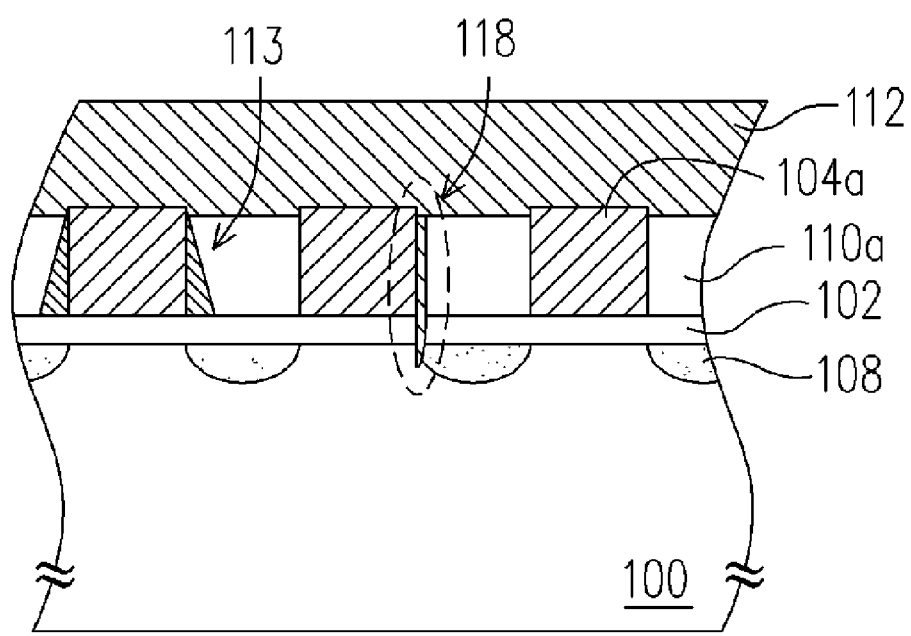
Figure 2A:
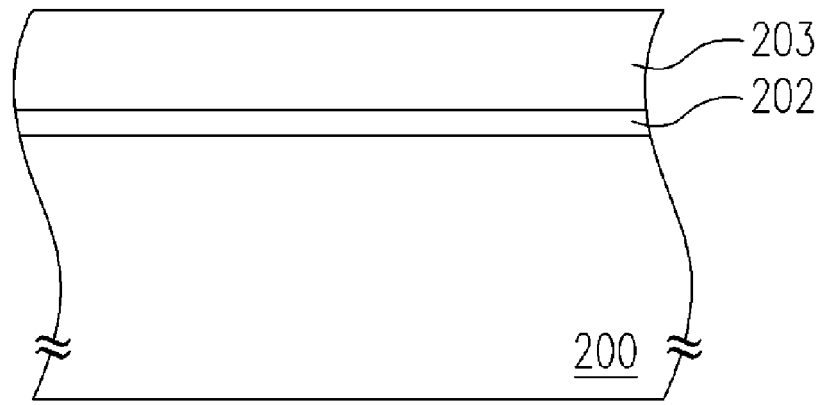
FIGS. 2A through 2G are schematic diagrams showing a method for manufacturing a non-volatile memory according to one of the preferred embodiment of the present invention.

As shown in FIG. 2A, a substrate 200 having a trench isolation structure (not shown) for defining an active region formed thereon is provided. A dielectric layer 202 is formed on the substrate 200. The dielectric layer 202 can be, for example but not limited to, a tunnel oxide layer made of silicon oxide by a thermal oxidation. In one embodiment, the dielectric layer 202 can be, for example but not limited to, a complex dielectric layer. The complex dielectric layer can be a silicon oxide/silicon nitride/silicon oxide layer formed by using a chemical vapor deposition.

A dummy gate layer 203 is formed on the dielectric layer 202. The dummy gate layer 203 can be, for example but not limited to, formed from silicon nitride or other proper dielectric material by a chemical vapor deposition.

Figure 2B:
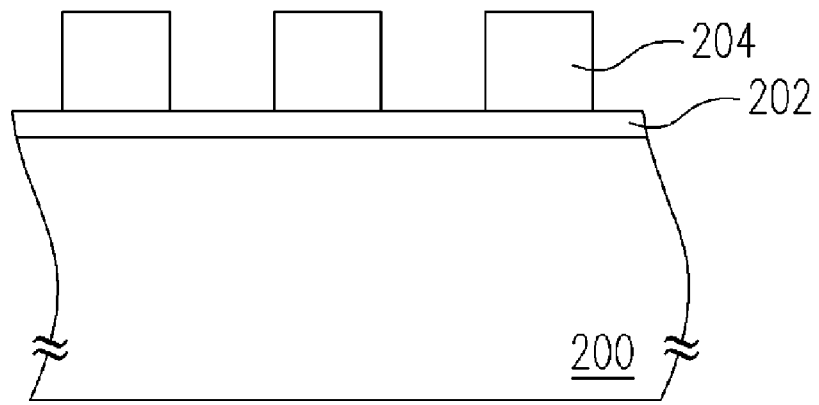

As shown in FIG. 2B, the dummy gate layer 203 is defined to form several dummy gates 204. The method for forming the dummy gates 204 comprises steps of forming a patterned photoreisist layer (not shown) on the dummy gate layer 203 and then performing an etching process to remove a portion of the dummy gate layer 203 to form the dummy gates 204.

Figure 2C:
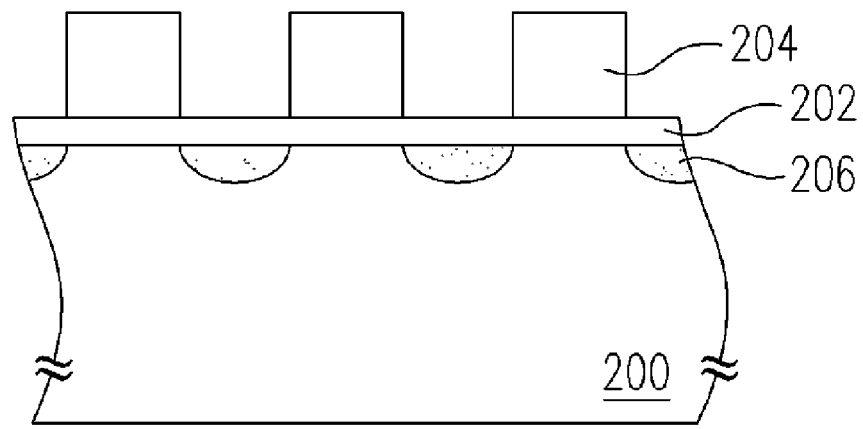

As shown in FIG. 2C, by using the dummy gates as a mask, a doped region 206 is formed in the substrate 200. The method for forming the doped region 206 includes an ion implantation process. Further, the doped region 206 is used as a source/drain region of the memory.

Figure 2D:
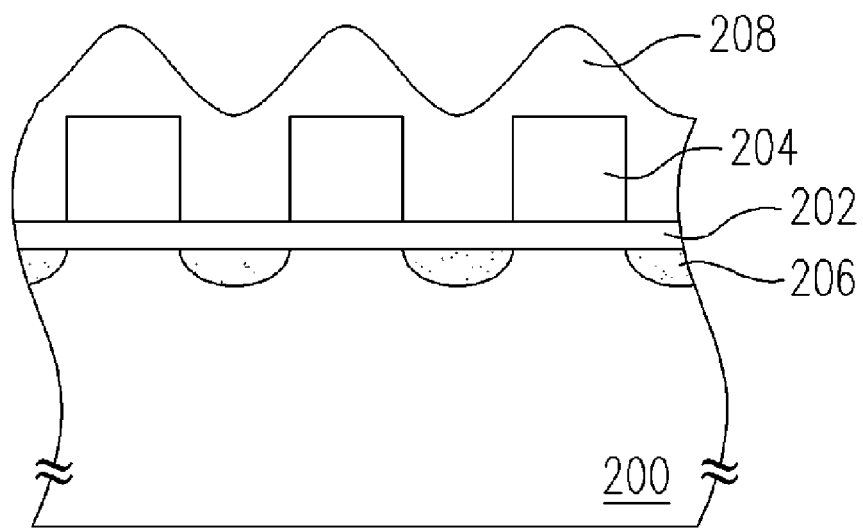

As shown in FIG. 2D, a dielectric layer 208 is formed over the substrate 200. The dielectric layer 208 can be, for example but not limited to, made of silicon oxide by a high density plasma chemical vapor deposition.

Figure 2E:
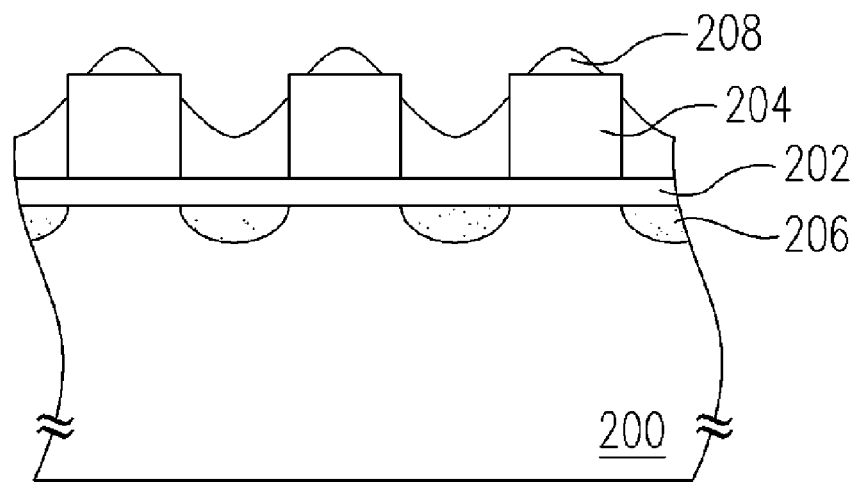

As shown in FIG. 2E, a chemical mechanical polishing process is performed to remove a portion of the dielectric layer 208 until the top corner of the dummy gates 204 is exposed.

Figure 2F:
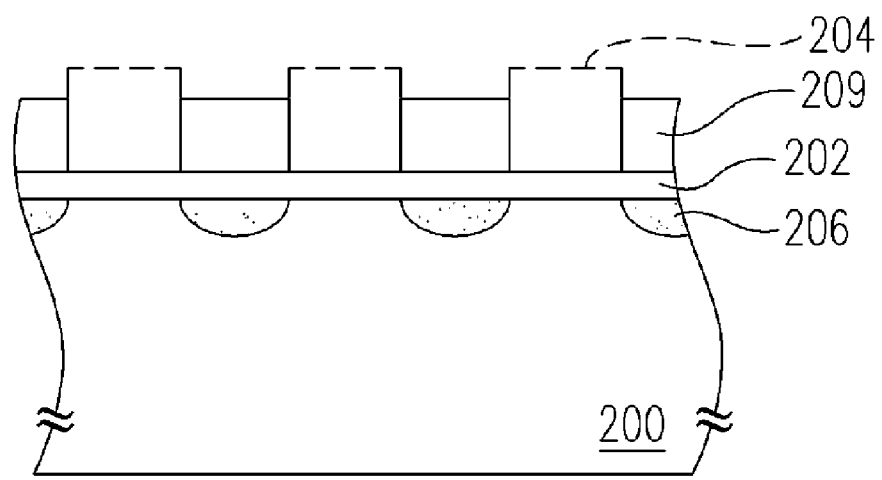

As shown in FIG. 2F, an anisotropic etching process is performed to remove a portion of the dielectric layer 208 to form a dielectric layer 209 on the dielectric layer 202 corresponding to the location of the doped region 206. The dummy gates 204 are removed until a portion of the surface of the dielectric layer is exposed. The method for removing the dummy gates 204 includes an etching process.

Figure 2G:
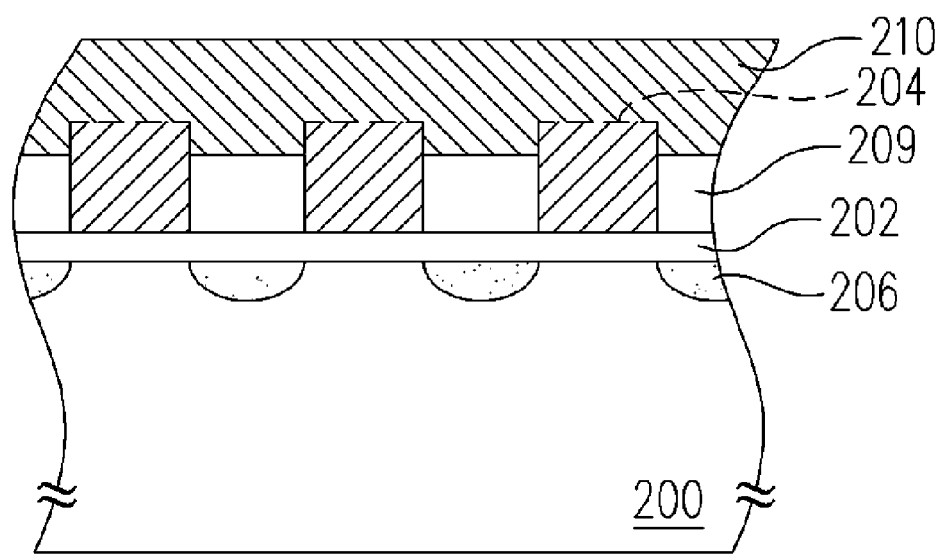

As shown in FIG. 2G, a conductive layer 210 is formed over the substrate 200 to cover the dielectric layer 202 and the dielectric layer 209. The conductive layer 210 can be, for example but not limited to, made of polysilicon by a chemical vapor deposition.

Thereafter, a sequence of conventional processes related to the manufacturing of the non-volatile memory are performed. Since the processes are well known in the art, the details of the following processes are not described hereafter.

In the present invention, the dummy gates 204 are served as the first polysilicon layer (poly 1). After the dummy gates 204 are removed, the conductive layer 210 is formed over the substrate 200 and fills the space where the dummy gates 204 are located to form the elements served as the first polysilicon layer and the second polysilicon layer (word line). More specifically, the process method provided by the present invention is a single poly process which is easier than the conventional double poly process. Therefore, the cost is decreased.

In addition, the dummy gates 204 made of dielectric material possesses a relatively vertical profile so that the problem of the bridging between the word lines due to the polysilicon residual can be solved. Hence, the yield is increased.

Moreover, since the conventional first polysilicon layer and the conventional second polysilicon layer (word line) are formed by performing only single one polysilicon process in the manufacturing procedure of the present invention, no defect such as holes penetrating through the dielectric layer 202 would lead to abnormal electrical connection between the conductive layer and the substrate. Hence, the problem of the device malfunction caused by the short can be solved. Therefore, the yield is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a non-volatile memory, comprising:
   forming a first dielectric layer on a substrate;
   forming a dummy gate layer on the first dielectric layer;
   defining the dummy gate layer to form a plurality of dummy gates;
   forming a doped region in the substrate by using the dummy gates as a mask;
   forming a second dielectric layer on a portion of the first dielectric layer corresponding to the location of the doped region;
   removing the dummy gates to expose a portion of the first dielectric layer; and
   forming a conductive layer over the substrate to cover the second dielectric layer and the first dielectric layer.

2. The method of claim 1, wherein the material of the dummy gate layer includes silicon nitride.

3. The method of claim 1, wherein the method for forming the dummy gate layer includes a chemical vapor deposition.

4. The method of claim 1, wherein the first dielectric layer includes a tunnel oxide layer.

5. The method of claim 4, wherein the material of the tunnel oxide layer includes silicon oxide.

6. The method of claim 4, wherein the method of forming the tunnel oxide layer includes a thermal oxidation.

7. The method of claim 1, wherein the first dielectric layer includes a complex dielectric layer.

8. The method of claim 7, wherein the complex dielectric layer includes a silicon oxide/silicon nitride/silicon oxide layer.

9. The method of claim 7, wherein the method for forming the complex dielectric layer includes a chemical vapor deposition.

10. The method of claim 1, wherein the method for removing the dummy gates includes an etching process.

11. The method of claim 1, wherein the material of the second dielectric layer includes silicon oxide.

12. The method of claim 1, wherein the method for forming the second dielectric layer includes a high density plasma chemical vapor deposition.

13. The method of claim 1, wherein the material of the conductive layer includes polysilicon.

14. The method of claim 1, wherein the method of forming the conductive layer includes a chemical vapor deposition.

15. The method of claim 1, wherein the method of forming the doped region includes an ion implantation process.

* * * * *